United States Patent
Bidwell et al.

(10) Patent No.: US 8,696,860 B1
(45) Date of Patent: *Apr. 15, 2014

(54) LAMINATION OF POLYMER THICK FILM CONDUCTOR COMPOSITIONS

(71) Applicants: Larry Alan Bidwell, Wake Forest, NC (US); Michael James Champ, Fuquay-Varina, NC (US); John C. Crumpton, Bahama, NC (US); Jay Robert Dorfman, Durham, NC (US)

(72) Inventors: Larry Alan Bidwell, Wake Forest, NC (US); Michael James Champ, Fuquay-Varina, NC (US); John C. Crumpton, Bahama, NC (US); Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/648,710

(22) Filed: Oct. 10, 2012

(51) Int. Cl.
*B32B 7/12* (2006.01)
*H01B 1/02* (2006.01)
*H01B 1/22* (2006.01)

(52) U.S. Cl.
USPC .......................................... 156/327; 252/514

(58) Field of Classification Search
USPC .......................................... 156/327; 252/514
See application file for complete search history.

(56) References Cited

U.S. PATENT DOCUMENTS

| 5,062,896 | A | 11/1991 | Huang et al. |
| 8,551,367 | B2 * | 10/2013 | Dorfman ...................... 252/512 |
| 8,557,146 | B1 * | 10/2013 | Dorfman ...................... 252/512 |
| 2010/0084757 | A1 | 4/2010 | Hariharan et al. |
| 2010/0127223 | A1* | 5/2010 | Dorfman ...................... 252/514 |
| 2010/0252616 | A1 | 10/2010 | Shearer et al. |

OTHER PUBLICATIONS

U.S. Appl. No. 13/668,404, filed Nov. 5, 2012, Jay Robert Dorfman.
U.S. Appl. No. 13/430,036, filed Mar. 26, 2012, Jay Robert Dorfman.

* cited by examiner

*Primary Examiner* — Michael Orlando

(57) ABSTRACT

This invention provides a method for using a polymer thick film conductor composition to form an electrical conductor in an electrical circuit, the method subjecting the deposited thick film conductor composition to lamination. The invention also provides a method for reducing the resistance of an electrical conductor formed from a polymer thick film conductor composition, the method comprising the step of subjecting the electrical conductor to lamination. The invention further provides devices containing electrical conductors made by these methods.

4 Claims, No Drawings

LAMINATION OF POLYMER THICK FILM CONDUCTOR COMPOSITIONS

FIELD OF THE INVENTION

The invention is directed to the lamination of polymer thick film (PTF) conductor compositions for use in many different applications. In one embodiment, the PTF conductor composition is used as a screen-printed conductor on a substrate such as polyester. The PTF conductor functions as an electrode. This composition may further be used for any other application where conductivity (low resistivity) is required.

BACKGROUND OF THE INVENTION

This invention is directed to a polymer thick film conductor composition for use in electronic devices. PTF silver conductors are quite prevalent in electronic circuitry as the conductor of choice due to the low resistivity (<50 milliohms/sq) and the reliability of silver. However, in recent years, the price of silver has tripled to the order of more than $30/troy oz and it is therefore becoming expensive to use in circuitry. Alternatives to silver are being sought with little compromise in electrical properties but at reduced cost. It is the purpose of this invention to provide such an alternative.

SUMMARY OF THE INVENTION

This invention provides a method for forming an electrical conductor in an electrical circuit, comprising:
  a) providing a substrate;
  b) providing a polymer thick film conductor composition selected from the group consisting of a polymer thick film solder alloy conductor composition, a polymer thick film solder alloy/metal conductor composition, and mixtures thereof;
  c) applying the thick film conductor composition onto the substrate; and
  d) subjecting the thick film conductor composition to lamination under temperature and/or pressure.

In an embodiment, the method further comprises a step of drying the thick film conductor composition, wherein said step is carried out following step (c) but before step (d). The composition may be processed at a time and temperature necessary to remove all solvent. Further, lamination after drying reduces the resistivity by 50-70%.

In one embodiment, the polymer thick film conductor composition is a polymer thick film solder alloy conductor composition comprising:
  (a) 65 to 95 wt % solder alloy powder consisting of tin, silver, and copper and possessing an average particle size of 2 to 18 μm and a surface area/mass ratio in the range of 0.2 to 1.3 $m^2/g$; dispersed in
  (b) 5 to 35 wt % organic medium comprising
    (i) a vinyl co-polymer resin of vinylidene chloride and acrylonitrile, dissolved in
    (2) organic solvent comprising a dibasic ester;
wherein the wt % are based on the total weight of the polymer thick film solder alloy conductor composition.

In another embodiment, the polymer thick film conductor composition is a polymer thick film solder alloy/metal conductor composition comprising:
  (a) 35 to 94 wt % solder alloy powder selected from the group consisting of (i) a tin, silver, and copper alloy powder, (ii) a tin and bismuth alloy powder, and (iii) mixtures thereof, said alloy powder consisting of particles possessing an average particle size of 2 to 18 μm and a surface area/mass ratio in the range of 0.2 to 1.3 $m^2/g$;
  (b) 1 to 30 wt % metal selected from the group consisting of silver, copper, gold, aluminum, and mixtures thereof, said metal consisting of particles possessing an average particle size of 2 to 18 μm and a surface area/mass ratio in the range of 0.1 to 2.3 $m^2/g$; and
  (c) 5 to 35 wt % organic medium comprising:
    (1) a resin that is a vinyl co-polymer resin of vinylidene chloride and acrylonitrile or a phenoxy resin; dissolved in
    (2) organic solvent comprising a dibasic ester or glycol ether;
with the proviso that if said resin is a phenoxy resin said metal is silver; wherein said solder alloy powder and said metal are dispersed in said organic medium and wherein the wt % are based on the total weight of the polymer thick film conductor composition.

The invention also provides an electrical device comprising an electrical conductor formed by any of the embodiments of the above described method.

The invention further provides a method for reducing the resistance of an electrical conductor formed from a polymer thick film conductor composition, the method comprising the step of subjecting the electrical conductor to lamination. It also provides an electrical device comprising such an electrical conductor.

DETAILED DESCRIPTION OF INVENTION

Generally, a thick film composition comprises a functional phase that imparts appropriate electrically functional properties to the composition. The functional phase comprises electrically functional powders dispersed in an organic medium that acts as a carrier for the functional phase. Generally, in thick film technology, the composition is fired to burn out the organics and to impart the electrically functional properties. However, in the case of polymer thick films, the organics remain as an integral part of the composition after drying. "Organics" as used herein comprise polymer, resin or binder components of a thick film composition. These terms may be used interchangeably and they all mean the same thing.

In one embodiment, the polymer thick film conductor composition is a polymer thick film solder alloy conductor composition comprising a SAC (tin, silver, copper) alloy powder dispersed in an organic medium comprising a polymer resin and a solvent.

In another embodiment, the polymer thick film conductor composition is a polymer thick film solder alloy/metal conductor composition comprising a SAC alloy powder, a Sn/Bi alloy powder or a mixture of both and a metal selected from the group consisting of silver, copper, gold, aluminum, and mixtures thereof, wherein the solder alloy powder and the metal are dispersed in an organic medium comprising a polymer resin and a solvent.

To summarize, the main components of the polymer thick film conductor compositions are conductor powders dispersed in an organic medium, which is comprised of polymer resin and solvent. The polymer thick film conductor compositions used in two embodiments are discussed below.

Thick Film Solder Alloy Conductor Composition Embodiment

A. Conductor Powder

The electrically functional powder in the thick film solder alloy conductor composition is a solder alloy conductor powder that contains tin, silver, and copper, known as SAC alloy, with tin the largest component, i.e. greater than 90% by weight.

The particle diameter and shape used in the solder alloy powder are particularly important and have to be appropriate to the application method. In one embodiment the particles are spherical. In another embodiment the particles are in flake form. The particle size distribution of the solder alloy particles is also critical with respect to the effectiveness of the invention. As a practical matter, the particle size is in the range of 1 to 100 µm. In an embodiment, the average particle size is 2 to 18 µm. In addition, the surface area/weight ratio of the solder alloy particles is in the range of 0.2-1.3 $m^2/g$.

Furthermore, it is known that small amounts of one or more other metals may be added to the solder alloy conductor compositions to improve the properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

An organic acid may be used as a reductant for the solder alloy to reduce any oxidation of the solder alloy surface.

B. Organic Medium

The solder alloy powder is typically mixed with an organic medium (vehicle) by mechanical mixing to form a paste-like composition, called "paste", having suitable consistency and rheology for printing. The organic medium must be one in which the solids are dispersible with an adequate degree of stability. The rheological properties of the organic medium must be such that they lend good application properties to the composition. Such properties include: dispersion of solids with an adequate degree of stability, good application of composition, appropriate viscosity, thixotropy, appropriate wettability of the substrate and the solids, a good drying rate, and dried film strength sufficient to withstand rough handling.

The organic medium comprises a solution of polymer in organic solvent(s). The organic medium is not conventional in the art and lends unique properties to the composition.

The resin used in the present embodiment is a vinyl co-polymer of vinylidene chloride and acrylonitrile which allows high weight loading of solder alloy powder and thus helps achieve both good adhesion to substrates and low resistivity (high conductivity), two critical properties for conductors in electronic circuitry. Additionally, this polymer seems to act as a self-fluxing component in the pastes so no external reductant is needed.

A wide variety of inert liquids can be used as solvents in the organic medium. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. In many embodiments of the present invention, solvents such as glycol ethers, ketones, esters and other solvents of like boiling points (in the range of 180° C. to 250° C.), and mixtures thereof may be used. In one embodiment the organic medium is based on dibasic esters and C-11 ketone solvent. Various combinations of these and other solvents are formulated to obtain the viscosity and volatility requirements desired.

Thick Film Solder Alloy/Metal Conductor Composition Embodiment

A. Conductor Powders

The electrically functional powder in the thick film solder alloy/metal conductor compositions is (1) solder alloy conductor powder selected from the group consisting of tin, silver, and copper alloy powders, known as SAC alloys, with tin the largest percentage, i.e. greater than 90% by weight, Sn/Bi alloy powders with at least 40 wt % tin and mixtures thereof and (2) metal powders/flakes selected from the group consisting of silver, copper, gold, aluminum or mixtures thereof.

The particle diameter and shape used on both the solder alloy powders and pure metal are particularly important and have to be appropriate to the application method. The particle size distribution of both the solder alloy particles and pure metal is also critical with respect to the effectiveness of the invention. As a practical matter, the particle size is in the range of 1 to 100 µm. In an embodiment, the average particle size of both the solder alloy and the metal is 2 to 18 µm. In addition, the surface area/weight ratio of the solder alloy particles is in the range of 0.2-1.3 $m^2/g$, while that of the metal is 0.1-2.3 m2/g. Although silver and copper are the two preferred metal particles, this embodiment is not limited to those two metals and others such as gold and aluminum could be used.

An organic acid may be used as a reductant for the solder alloy to reduce any oxidation of the solder alloy surface, although it is not required here.

B. Organic Medium

The powders are typically mixed with an organic medium (vehicle) by mechanical mixing to form a paste-like composition, called "paste", having suitable consistency and rheology for printing. The organic medium must be one in which the solids are dispersible with an adequate degree of stability. The rheological properties of the organic medium must be such that they lend good application properties to the composition. Such properties include: dispersion of solids with an adequate degree of stability, good application of composition, appropriate viscosity, thixotropy, appropriate wettability of the substrate and the solids, a good drying rate, and dried film strength sufficient to withstand rough handling.

The organic medium comprises a solution of polymer in organic solvent(s). The organic medium is not conventional in the art and lends unique properties to the composition.

The polymer resin of the present embodiment is particularly important. The resin of choice used in the present invention is a vinyl co-polymer of vinylidene chloride and acrylonitrile which allows high weight loading of solder alloy powder and thus helps achieve both good adhesion to substrates and low resistivity (high conductivity), two critical properties for conductors in electronic circuitry. Additionally, this polymer seems to act as a self-fluxing component in the pastes so no external reductant is needed. Alternatively, a phenoxy resin may be used in some formulations as well, but only when silver is the added metal.

A wide variety of inert liquids can be used as solvents in the organic medium. The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. In many embodiments of the present invention, solvents such as glycol ethers, ketones, esters and other solvents of like boiling points (in the range of 180° C. to 250° C.), and mixtures thereof may be used. In one embodiment the organic medium is based on dibasic esters and C-11 ketone. Various combinations of these and other solvents are formulated to obtain the viscosity and volatility requirements desired.

Application of Thick Films

The polymer thick film conductor compositions also known as "pastes" are typically deposited on a substrate, e.g., Polyester, that is essentially impermeable to gases and moisture. The substrate can also be a sheet of flexible material. An example is an impermeable plastic such as a composite material made up of a combination of plastic sheet with optional metallic or dielectric layers deposited thereupon. The substrate must be such as to withstand the processing temperature of 140° C. In one embodiment, the substrate can be a build-up of layers with metalized solder alloy paste.

The deposition of the polymer thick film solder alloy/metal compositions is performed preferably by screen printing, although other deposition techniques such as stencil printing, syringe dispensing or coating techniques can be utilized. In the case of screen-printing, the screen mesh size controls the thickness of deposited thick film.

Lamination:

Lamination is the technique of manufacturing a material in multiple layers, so that the composite material achieves improved strength, stability, appearance or other properties from the use of differing materials. A laminate is usually permanently assembled by heat, pressure, welding, or adhesives. In one embodiment, a combination of heat and pressure is used. Roll laminators typically use two rolls to complete the lamination process, with one roll being on top and the other roll on the bottom. These rolls slide onto metal bars, known as mandrels, which are then placed in the machine and feed through it. Various temperature, pressure settings may be used. The lamination of the deposited thick film conductor composition provides conductors with low resistivity, i.e., as low as 15 milliohm/sq.

In one embodiment, prior to the lamination, the deposited thick film conductor composition is dried by exposure to heat at low temperatures, typically for 10-15 min at 140° C. This is achieved with an initial drying temperature approximately 80° C. below the liquidus temperature 217° C. of one of the solder alloys (SAC305).

The present invention will be discussed in further detail by giving practical examples. The scope of the present invention, however, is not limited in any way by these practical examples.

EXAMPLE AND COMPARATIVE EXPERIMENT

Comparative Experiment A

A PTF solder alloy/metal conductor composition was prepared by mixing solder alloy powder SAC305 (AMTECH, SMT International LLC, Deep River, Conn.) with an average spherical particle size of 10 μm (range was 5-15 μm) and silver flake with an average particle size of 5 microns with an organic medium composed of a co-polymer of vinylidene chloride and acrylonitrile resin (Saran™ F-310 resin, Dow Chemical Co., Midland, Mich.). The molecular weight of the resin was approximately 25,000. A solvent was used to dissolve the resin completely prior to adding the solder alloy powder. That solvent was a 50/50 blend of dibasic esters (DuPont, Wilmington, Del.) and Eastman™ C-11 Ketone solvent (Eastman Chemical, Kingsport, Tenn.).

The composition of the PTF solder alloy/metal conductor composition is given below:

58.25% SAC305 solder alloy powder-(96.5% Sn, 3% Ag, 0.5% Cu)
9.71 Organic medium (19.5% resin/80.5% solvent)
29.12 Silver Flake (average size 5 microns)
0.92 Carbitol Acetate
2.00 DiBasic Esters This composition was mixed for 10 minutes in a Thinky-type mixer. The composition was use to screen print a pattern on glass. Using a 280 mesh stainless steel screen, a series of lines were printed, and the solder alloy paste was dried at 140° C. for 10 min. in a forced air box oven. The resistivity was then measured as 35 milliohm/sq at a thickness of 30 microns.

Example 1

The same PTF solder alloy/metal composition was essentially prepared and printed as described in Comparative Experiment A, except that the composition was subjected to lamination after drying. All other properties of the formulation, solder alloy powder distribution, and the subsequent processing were the same as Comparative Experiment A.

The lamination was performed on a Uniaxial type Laminator. The temperature was held at 70° C. and the pressure was varied from 1000 to 30000 pounds. The resistivity for this composition varied from 15 to 20 milliohm/sq, which is substantially reduced from the 35 milliohm/sq obtained with oven drying only in Comparative Experiment A. It is apparent that the lamination has a beneficial effect upon the resistivity of the polymer thick film conductor composition.

What is claimed is:

1. A method for forming an electrical conductor in an electrical circuit, comprising:
    a) providing a substrate;
    b) providing a polymer thick film solder alloy conductor composition comprising:
        (i) 65 to 95 wt % SAC solder alloy powder consisting of tin, silver, and copper, wherein said tin is greater than 90 wt % of said SAC solder alloy powder, and said SAC solder alloy powder possessing an average particle size of 2 to 18 μm and a surface area/mass ratio in the range of 0.2 to 1.3 $m^2/\mu g$; dispersed in
        (ii) 5 to 35 wt % organic medium comprising:
            (1) a vinyl co-polymer resin of vinylidene chloride and acrylonitrile, dissolved in
            (2) organic solvent comprising a dibasic ester, wherein the wt % of said SAC solder alloy powder and said organic medium are based on the total weight of the polymer thick film solder alloy conductor composition;
    c) applying said thick film conductor composition onto said substrate; and
    d) subjecting said thick film conductor composition to amination to form said electrical conductor.

2. The method of claim 1, said method further comprising a step of drying said thick film conductor composition, wherein said step of drying is carried out following step (c) but before step (d).

3. A method for forming an electrical conductor in an electrical circuit, comprising:
    (a) providing a substrate;
    (b) providing a polymer thick film solder alloy/metal conductor composition comprising:
        (1) 35 to 94 wt % solder alloy powder selected from the group consisting of (i) SAC solder alloy powder consisting of tin, silver, and copper, wherein said tin is greater than 90 wt % of said SAC solder alloy powder,
        (ii) a tin and bismuth alloy powder, wherein said tin is at least 40 wt % of said tin and bismuth alloy powder, and (iii) mixtures thereof, said alloy powder consisting of particles possessing an average particle size of 2 to 18 μm and a surface area/mass ratio in the range of 0.2 to 1.3 $m^2/g$;

(2) 1 to 30 wt % metal selected from the group consisting of silver, copper, gold, aluminum and mixtures thereof, said metal consisting of particles possessing an average particle size of 2 to 18 μm and a surface area/mass ratio in the range of 0.1 to 2.3 $m^2/g$; and (3) 5 to 35 wt % organic medium comprising:
  (i) a resin that is a vinyl co-polymer resin of vinylidene chloride and acrylonitrile or a phenoxy resin; dissolved in
  (ii) organic solvent comprising a dibasic ester or glycol ether, with the proviso that if said resin is a phenoxy resin said metal is silver, wherein said solder alloy powder and said metal are dispersed in said organic medium and wherein the wt % of said solder alloy powder and said metal are based on the total weight of the polymer thick film conductor composition;

(c) applying said thick film conductor composition onto said substrate; and (d) subjecting said thick film conductor composition to lamination to form said electrical conductor.

4. The method of claim 3, said method further comprising a step of drying said thick film conductor composition, wherein said step of drying is carded out following step (c) but before step (d).

* * * * *

UNITED STATES PATENT AND TRADEMARK OFFICE
CERTIFICATE OF CORRECTION

PATENT NO. : 8,696,860 B1  Page 1 of 1
APPLICATION NO. : 13/648710
DATED : April 15, 2014
INVENTOR(S) : Larry Alan Bidwell et al.

It is certified that error appears in the above-identified patent and that said Letters Patent is hereby corrected as shown below:

In the Claims

Column 6, Line 41, Claim 1, please change "$m^2/\mu g$" to read -- $m^2/g$ --.

Column 7, Line 29, Claim 4, please change "carded" to read -- carried --.

Signed and Sealed this
Twenty-fourth Day of June, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,696,860 B1 | Page 1 of 1 |
| APPLICATION NO. | : 13/648710 | |
| DATED | : April 15, 2014 | |
| INVENTOR(S) | : Larry Alan Bidwell et al. | |

It is certified that error appears in the above-identified patent and that said Letters Patent is hereby corrected as shown below:

In the Claims

Column 6, Line 53, Claim 1, please change "amination" to read -- lamination --.

Signed and Sealed this
Seventeenth Day of February, 2015

Michelle K. Lee
*Deputy Director of the United States Patent and Trademark Office*